(12) United States Patent
Hanada et al.

(10) Patent No.: US 12,068,399 B2
(45) Date of Patent: Aug. 20, 2024

(54) SEMICONDUCTOR DEVICE MANUFACTURING METHOD

(71) Applicant: Japan Display Inc., Tokyo (JP)

(72) Inventors: Akihiro Hanada, Tokyo (JP); Takuo Kaitoh, Tokyo (JP); Ryo Onodera, Tokyo (JP); Takashi Okada, Tokyo (JP); Tomoyuki Ito, Tokyo (JP); Toshiki Kaneko, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 405 days.

(21) Appl. No.: 17/511,633

(22) Filed: Oct. 27, 2021

(65) Prior Publication Data
US 2022/0140117 A1    May 5, 2022

(30) Foreign Application Priority Data

Oct. 29, 2020  (JP) .................................. 2020-181414

(51) Int. Cl.
| | | |
|---|---|---|
| H01L 29/66 | (2006.01) | |
| H01L 21/385 | (2006.01) | |
| H01L 27/12 | (2006.01) | |
| H01L 29/786 | (2006.01) | |

(52) U.S. Cl.
CPC ...... H01L 29/66969 (2013.01); H01L 21/385 (2013.01); H01L 27/1225 (2013.01); H01L 29/7869 (2013.01)

(58) Field of Classification Search
CPC ........... H01L 29/66969; H01L 29/7869; H01L 29/78696; H01L 27/1225; H01L 21/385
See application file for complete search history.

(56) References Cited

U.S. PATENT DOCUMENTS

| | | | |
|---|---|---|---|
| 2016/0155828 A1* | 6/2016 | Sugawara | H01L 21/02565 438/104 |
| 2016/0190331 A1* | 6/2016 | Miyake | H05B 44/00 257/40 |
| 2016/0204126 A1* | 7/2016 | Amano | H01L 27/1259 438/151 |
| 2016/0260836 A1* | 9/2016 | Okazaki | H01L 27/1248 |
| 2017/0250289 A1* | 8/2017 | Sugawara | H01L 21/02233 |
| 2017/0278872 A1 | 9/2017 | Ohara | |
| 2020/0259020 A1 | 8/2020 | Watakabe et al. | |

FOREIGN PATENT DOCUMENTS

| | | | | |
|---|---|---|---|---|
| JP | 2012216806 A | * | 11/2012 | ......... H01L 29/4908 |
| JP | 2017-183312 A | | 10/2017 | |
| JP | 6541832 B2 | * | 7/2019 | ....... H01L 29/41733 |
| JP | 2020-129635 A | | 8/2020 | |

* cited by examiner

*Primary Examiner* — Joseph C. Nicely
(74) *Attorney, Agent, or Firm* — XSENSUS LLP

(57) ABSTRACT

According to one embodiment, a method for manufacturing a semiconductor device, includes forming a first insulating film which covers a gate electrode, forming an island-shaped oxide semiconductor in contact with the first insulating film, forming a second insulating film which covers the oxide semiconductor, forming a source electrode in contact with the oxide semiconductor, forming a drain electrode in contact with the oxide semiconductor, forming a third insulating film which covers the source electrode and the drain electrode and forming a channel region between the source electrode and the drain electrode by supplying oxygen from the third insulating film to the oxide semiconductor via the second insulating film.

9 Claims, 8 Drawing Sheets

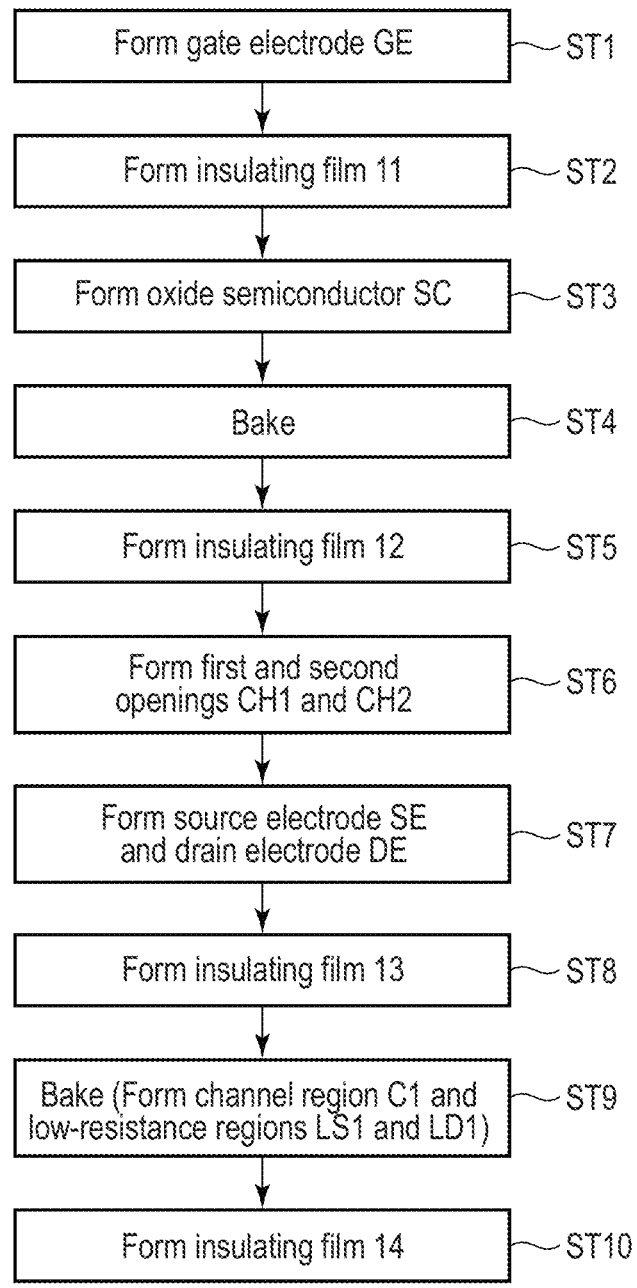
F I G. 4

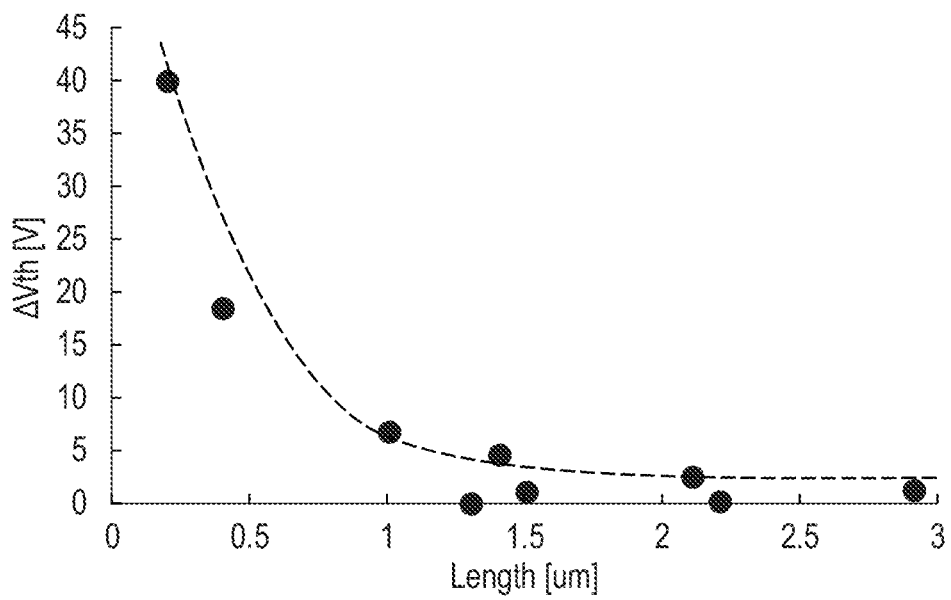
F I G. 11
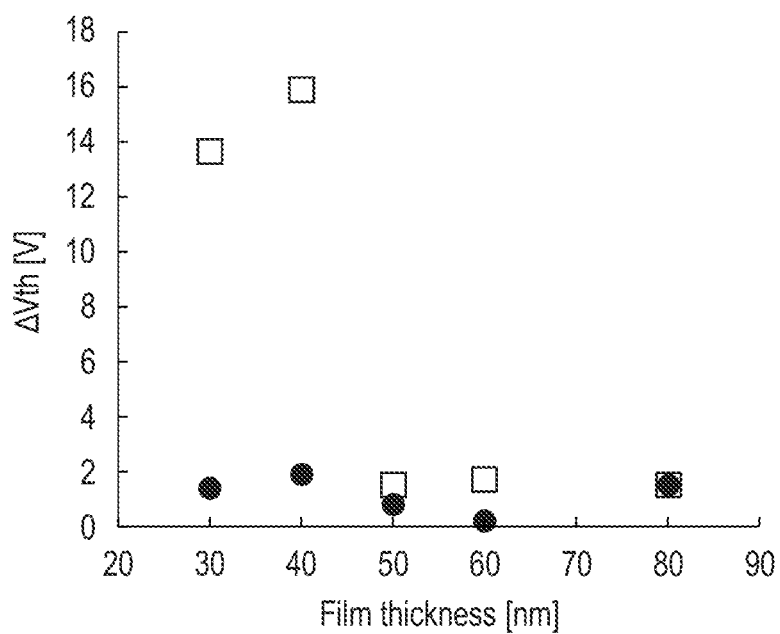
F I G. 12

SEMICONDUCTOR DEVICE MANUFACTURING METHOD

CROSS-REFERENCE TO RELATED APPLICATIONS

This application is based upon and claims the benefit of priority from Japanese Patent Application No. 2020-181414, filed Oct. 29, 2020, the entire contents of which are incorporated herein by reference.

FIELD

Embodiments described herein relate generally to a method for manufacturing a semiconductor device.

BACKGROUND

In the field of the liquid crystal display, such a technology is proposed that a transistor comprising an oxide semiconductor is provided in a pixel circuit in a display area and a transistor comprising a silicon semiconductor is provided in a drive circuit in a peripheral area.

BRIEF DESCRIPTION OF THE DRAWINGS

FIG. 4 is a diagram illustrating a method of manufacturing the transistor TR shown in FIG. 3.

FIG. 11 is a diagram showing the relationship between the lengths of the low resistance regions LS1 and LD1 and a shift amount ΔVth.

FIG. 12 is a diagram showing the relationship between the film thickness of an oxide semiconductor SC and the shift amount ΔVth.

DETAILED DESCRIPTION

Figure 1:
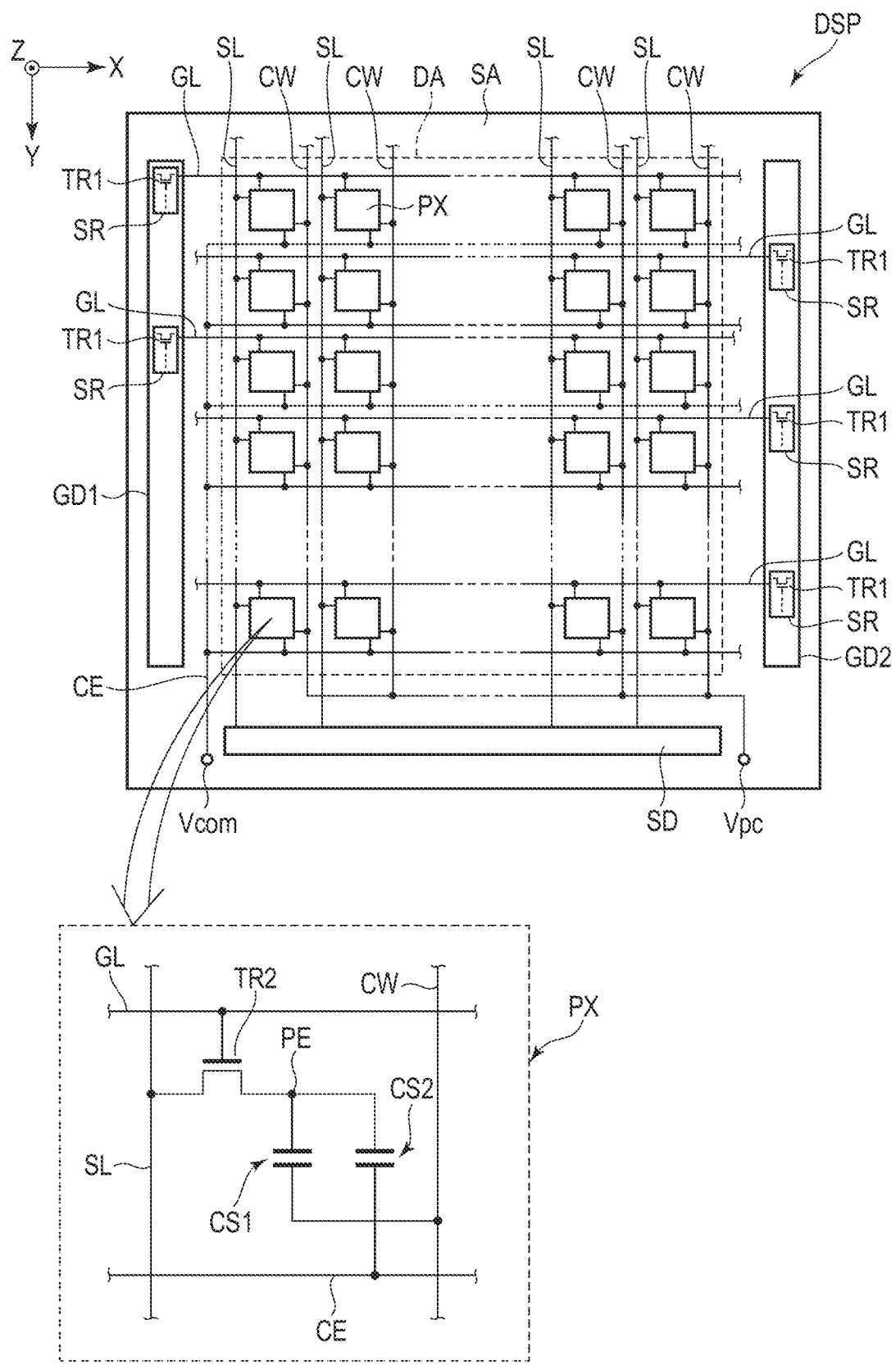
FIG. 1 is a plan view showing a configuration of a display device DSP of this embodiment.

In general, according to one embodiment, a method for manufacturing a semiconductor device, includes forming a gate electrode, forming a first insulating film which covers the gate electrode, forming, above the first gate electrode, an island-shaped oxide semiconductor in contact with the first insulating film, forming a second insulating film which covers the oxide semiconductor, forming, in the second insulating film, first and second openings penetrating to the oxide semiconductor, forming a source electrode in contact with the oxide semiconductor in the first opening, forming a drain electrode in contact with the oxide semiconductor in the second opening, forming a third insulating film which covers the source electrode and the drain electrode and forming a channel region between the source electrode and the drain electrode by supplying oxygen from the third insulating film to the oxide semiconductor via the second insulating film.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, and the like of the respective parts are illustrated schematically in the drawings, rather than as an accurate representation of what is implemented, but such schematic illustration is merely exemplary, and in no way restricts the interpretation of the invention. Furthermore, in the specification and drawings, structural elements which function in the same manner as or a similar manner to those described in connection with preceding drawings are denoted by the same reference numbers, and overlapping detailed descriptions thereof may be appropriately omitted.

Note that the figures show an X axis, Y axis and Z axis orthogonal to each other, as needed for making it easier to understand the descriptions. Directions along the X axis, Y axis and Z axis are referred to as a first direction X, a second direction Y and a third direction Z, respectively. A plane defined by the first direction X and the second direction Y is an X-Y plane and a view toward the X-Y plane will be referred to as a plan view.

In this embodiment, an electrophoretic display device will be described as an example of the display device using a semiconductor device. Note that the main configuration disclosed in this embodiment is applicable, in addition to liquid crystal display device, to display device comprising spontaneous light-emitting devices such as organic electroluminescent (EL) devices, micro-LEDs and mini-LEDs.

FIG. 1 is a plan view showing the display device DSP according to this embodiment. The display device DSP comprises a display area DA which display images and a peripheral area (non-display area) SA around the display area DA. In the example shown in FIG. 1, the peripheral area SA is formed into a frame shape which surrounds the display area DA.

The display device DSP comprises gate drivers GD1 and GD2 and a source driver SD in the peripheral area SA. Each of the gate drivers GD1 and GD2 comprises a plurality of shift registers SR. The shift registers SR each comprise a first transistor TR1. Thus, the gate drivers GD1 and GD2 are formed on the same substrate together with each element of the display area DA.

The display device DSP comprises a plurality of pixels PX, a plurality of gate lines GL, a plurality of source lines SL, a plurality of capacitive wiring lines CW and a common electrode CE in the display area DA. The pixels PX are arranged in a matrix in the first direction X and the second direction Y.

The gate lines GL each extend along the first direction X and are arranged to be spaced apart from each other in the second direction Y. Note that the gate lines GL may be referred to as scanning lines. The gate lines GL are electrically connected to the gate drivers GD1 and GD2, respectively. For example, odd-numbered gate lines GL are connected to the respective shift registers SR of the gate driver GD1, whereas even-numbered gate lines GL are connected to the respective shift registers SR of the gate driver GD2. The gate lines GL are driven by the gate drivers GD1 and GD2, respectively.

The source lines SL each extend along the second direction Y and are arranged to be spaced apart from each other in the first direction X. Note that the source lines SL may be referred to as signal lines. In the display area DA, the source lines SL intersect the gate lines GL. The source lines SL are electrically connected to the source driver SD. Each of the source lines SL is driven by the source driver SD.

The capacitive wiring lines CW extend along the first direction X or the second direction Y. The capacitive wiring lines CW are bundled, for example, in a peripheral area SA and connected to a voltage supply portion Vpc to which a predetermined voltage is supplied.

The common electrode CE is disposed over a plurality of pixels PX. The common electrode CE is connected to a voltage supply portion Vcom, to which a predetermined voltage is supplied.

As shown in an enlarged view in FIG. 1, each pixel PX comprises a second transistor TR2 and a pixel electrode PE. As will be described later, the first and second transistors TR1 and TR2 are formed from thin-film transistors (TFTs), for example. The second transistor TR2 is electrically connected to the gate line GL and the source line SL. The gate line GL is electrically connected to the second transistor TR2 in each of those pixels PX which are aligned in the first direction X. The source line SL is electrically connected to the second transistor TR2 in each of those pixels PX which are aligned in the second direction Y.

The pixel electrode PE is electrically connected to the second transistor TR2. The pixel electrodes PE each oppose the common electrode CE. A capacitance CS1 is formed between the pixel electrode PE and the capacitive wiring line CW. A capacitance CS2 is formed between the common electrode CE and the pixel electrode PE.

A substrate comprising the first and second transistors TR1 and TR2, various wiring lines and various electrodes is referred to as a semiconductor device.

Figure 2:
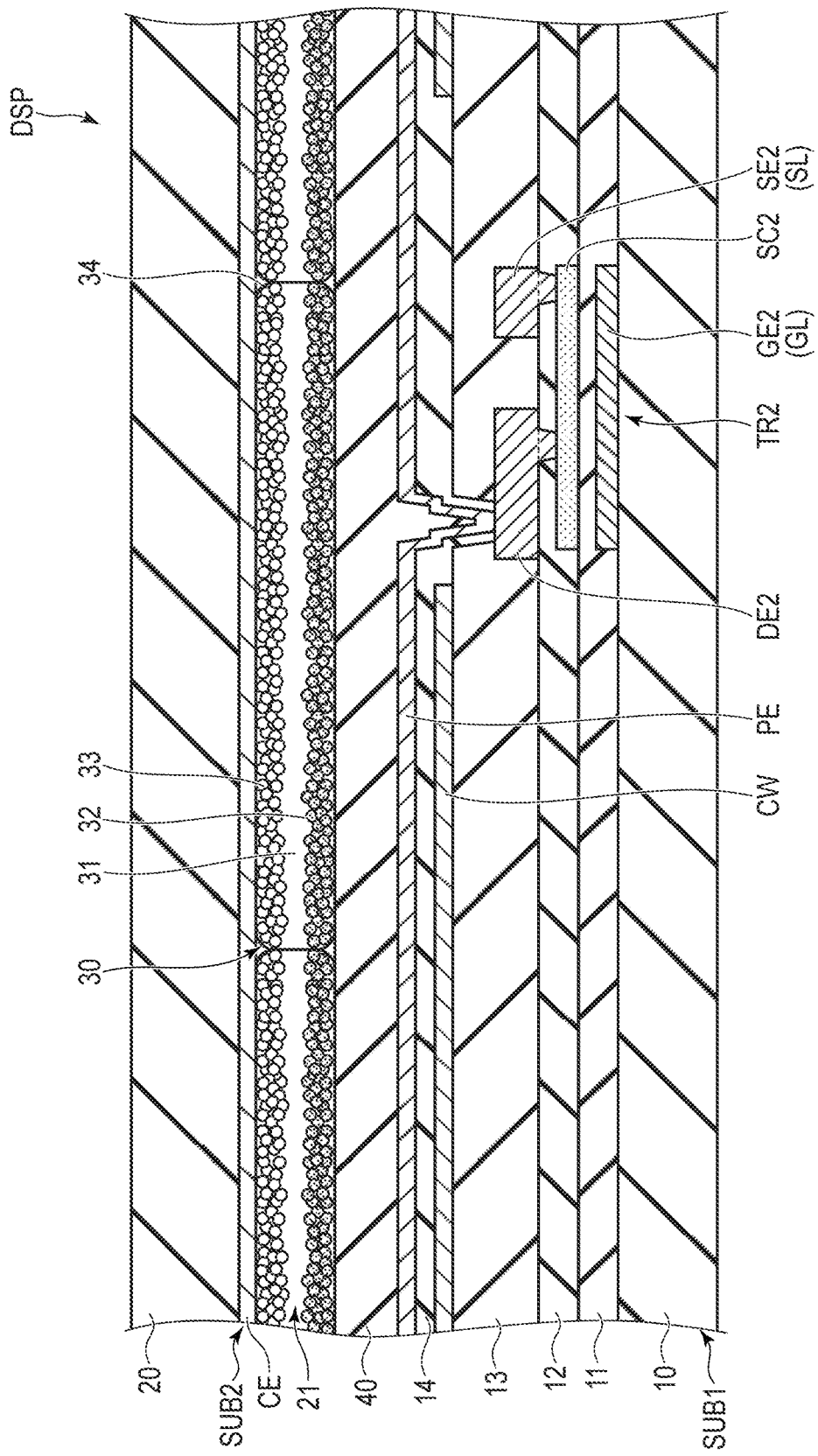
FIG. 2 is a cross-sectional view of the display device DSP including pixels PX shown in FIG. 1.

FIG. 2 is a cross-sectional view of the display device DSP including a pixel PX shown in FIG. 1. The first substrate SUB1 comprises an insulating substrate 10, insulating films 11 to 14, a second transistor TR2, capacitive wiring lines CW and a pixel electrodes PE. Note that the configuration of the second transistor TR2 is illustrated in a simplified form. Further, each of the insulating films 11 to 14 is also shown in a simplified form.

The insulating substrate 10 is formed of an insulating material such as resin, glass or the like. Although the details thereof will be described later, the second transistor TR2 comprises a second gate electrode GE2 integrated with the gate line GL, a second source electrode SE2 integrated with the source line SL, a second drain electrode DE2 and a second oxide semiconductor SC2. In this specification, an electrode on a side electrically connected to the source line SL is referred to as the second source electrode SE2, whereas an electrode on a side electrically connected to the pixel electrode PE is referred to as the second drain electrode DE2.

The insulating film 11 is interposed between the second gate electrode GE2 and the second oxide semiconductor SC2. The insulating film 12 is interposed between the second oxide semiconductor SC2 and the second source electrode SE2, and between the second oxide semiconductor SC2 and the second drain electrode DE2. The insulating film 13 covers the second source electrode SE2 and the second drain electrode DE2. Note that the insulating film 11 and the insulating film 12, which are inorganic insulating films, may be monolayers or may be a stacked layer body constituted by one or more types of inorganic insulating films. The insulating film 13 is, for example, a stacked layer body of one or more types of inorganic insulating films and organic insulating films. One inorganic insulating film included in the insulating film 13 directly covers the second source electrode SE2 and the second drain electrode DE2.

The capacitive wiring lines CW are disposed on the insulating film 13 and covered by the insulating film 14. The pixel electrode PE is disposed on the insulating film 14. The pixel electrode PE is in contact with the second drain electrode DE2 and is electrically connected to the second transistor TR2.

The second substrate SUB2 comprises an insulating substrate 20, a common electrode CE and an electrophoretic element 21. The insulating substrate 20 is formed of an insulating material such as resin, glass or the like. The common electrode CE is located between the insulating substrate 20 and the electrophoretic element 21. The electrophoretic element 21 is located between the pixel electrode PE and the common electrode CE. The electrophoretic element 21 is formed of a plurality of microcapsules 30 arranged without substantial gaps between each other.

The first substrate SUB1 and the second substrate SUB2 are adhered together by an adhesive layer 40. In the example illustrated in the figure, the adhesive layer 40 is located between the pixel electrode PE and the electrophoretic element 21.

The microcapsules 30 have a particle diameter of, for example, about 20 μm to 70 μm. A plurality of microcapsules 30 are placed between one pixel electrode PE and the common electrode CE. The microcapsules 30 comprise a dispersant 31, a plurality of black particles 32 and a plurality of white particles 33. The black particles 32 and white particles 33 may be referred to as electrophoretic particles.

An outer shell 34 of each microcapsule 30 is formed of a transparent resin such as acrylic resin. The dispersant 31 is a liquid in which the black particles 32 and white particles 33 are dispersed within the microcapsule 30. The black particles 32 and white particles 33 have charges of polarities opposite to each other. For example, the black particles 32 are positively charged, whereas the white particles 33 are negatively charged.

In the electrophoretic device 21 with the above configuration, when a pixel PX displays black, the pixel electrode PE is held at a relatively high potential as compared to that of the common electrode CE. That is, when the potential of the common electrode CE is set as a reference potential, the pixel electrode PE is held in positive polarity. As a result, the positively charged black particles 32 are attracted to the common electrode CE, whereas the negatively charged white particles 33 are attracted to the pixel electrode PE. Thus, when the pixel PX is observed from above the second substrate SUB2, black color is visually recognized.

On the other hand, when a pixel PX displays white, the pixel electrode PE is held at a relatively low potential as compared to that of the common electrode CE. That is, when the potential of the common electrode CE is set as the reference potential, the pixel electrode PE is held in negative polarity. As a result, the negatively charged white particles 33 are attracted to the common electrode CE, whereas the positively charged black particles 32 are attracted to the pixel electrode PE. Thus, white color is visually recognized when the pixel PX is observed.

The electrophoretic display device described here is not limited to of monochrome specifications, but can as well be applied to color specifications in which a plurality of color particles, including red, green and blue particles, are operated by electrophoresis. In the case of color specifications, in particular, the application of a high voltage can improve the speed of electrophoresis, which is originally slow, which makes it possible to achieve such an advantage of enabling high-speed rewriting of color images.

Figure 3:
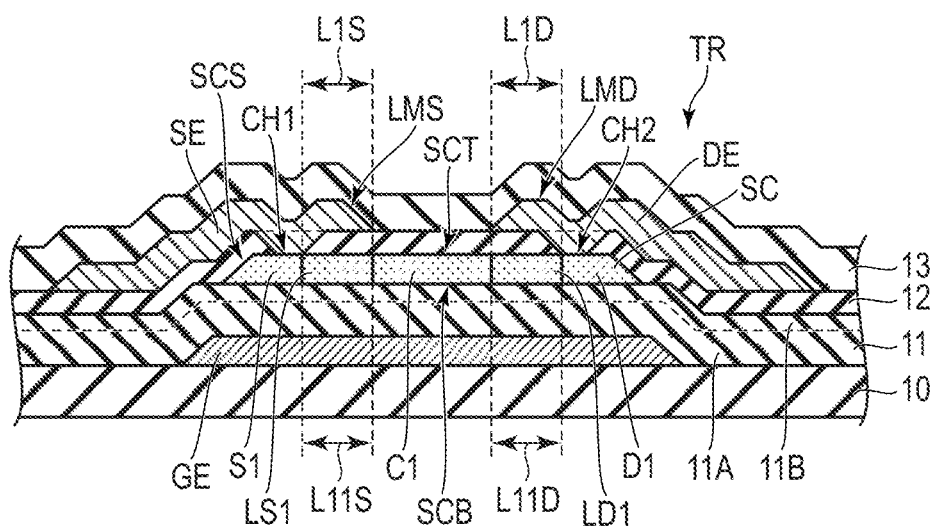
FIG. 3 is a cross-sectional view of an example of a transistor TR.

FIG. 3 is a cross-sectional view showing an example of the transistor TR. The transistor TR described here can be applied to both the first transistor TR1 and the second transistor TR2 described above. The transistor TR comprises a gate electrode GE, an oxide semiconductor SC, a source electrode SE, and a drain electrode DE.

The gate electrode GE is located above the insulating substrate 10. In the example shown in FIG. 3, the gate electrode GE is in contact with the insulating substrate 10, but so other insulating film may be interposed between the insulating substrate 10 and the gate electrode GE.

The insulating film 11 is an inorganic insulating film and covers the gate electrode GE. In the example shown in FIG. 3, the insulating film 11 is a stacked layer body of a thin film (first thin film) 11A and another thin film (second thin film) 11B. The thin film 11A is formed of silicon nitride (SiN) and directly covers the insulating substrate 10 and the gate electrode GE. The thin film 11B is formed of silicon oxide (SiO) and is stacked directly on the thin film 11A. For example, the film thickness of thin film 11B is less than that of thin film 11A. For example, the film thickness of the thin film 11A is 50 to 400 nm, and the film thickness of the thin film 11B is 20 to 300 nm. The film thickness of the insulating film 11 is 300 nm or greater. The insulating film 11 may be a single layer body of a thin film formed of silicon oxide.

The oxide semiconductor SC is disposed above the gate electrode GE and is in contact with the insulating film 11. In other words, a lower surface SCB of the oxide semiconductor SC is in contact with the insulating film 11, which is a silicon oxide.

The insulating film 12 directly covers the oxide semiconductor SC and the insulating film 11. The insulating film 12 is an inorganic insulating film formed of silicon oxide (SiO). In other words, an upper surface SCT and side surfaces SCS of the oxide semiconductor SC are in contact with the insulating film 12, which is a silicon oxide.

The source electrode SE and the drain electrode DE are disposed on the insulating film 12 and are in contact with the insulating film 12. Further, the source electrode SE is spaced apart from the drain electrode DE.

The source electrode SE is in contact with the oxide semiconductor SC in a first opening CH1 of the insulating film 12. The drain electrode DE is in contact with the oxide semiconductor SC in a second opening CH2 of the insulating film 12.

The insulating film 13 directly covers the source electrode SE and the drain electrode DE. The insulating film 13 is, for example, an inorganic insulating film formed of silicon oxide (SiO). The insulating film 13 is in contact with the insulating film 12 between the source electrode SE and the drain electrode DE. For example, the film thickness of the insulating film 13 is greater than that of the insulating film 12.

The gate electrode GE, the source electrode SE, and the drain electrode DE are formed, for example, of a metal material such as aluminum (Al), titanium (Ti), molybdenum (Mo), tungsten (W), silver (Ag), copper (Cu) or chromium (Cr), or an alloy of any combination of these metal materials.

The oxide semiconductor SC includes a channel region C1, low-resistance regions LS1 and LD1, a source region S1 and a drain region D1. The low-resistance regions LS1 and LD1 are located adjacent to the channel region C1. The low-resistance region LS1 is located between the channel region C1 and the source region S1. The low-resistance region LD1 is located between the channel region C1 and the drain region D1.

The channel region C1 is a region with the highest resistance in the oxide semiconductor SC and overlaps a gap between the source electrode SE and the drain electrode DE (or a portion where the insulating film 13 is directly stacked on the insulating film 12).

The low-resistance regions LS1 and LD1 are regions of a resistance lower than that of the channel region C1. The low-resistance region LS1 overlaps the stacked layer body LMS of the insulating film 12 and the source electrode SE between the first and second openings CH1 and CH2. The low-resistance region LD1 overlaps the stacked layer body LMD of the insulating film 12 and the drain electrode DE between the first and second openings CH1 and CH2.

The source region S1 is a region of a resistance lower than that of the low-resistance region LS1 and is in contact with the source electrode SE in the first opening CH1. The drain region D1 is a region of a resistance lower than that of the low-resistance region LD1 and is in contact with the drain electrode DE in the second opening CH2.

In the oxide semiconductors SC, at least the channel region C1 and the low-resistance regions LS1 and LD1 are located directly above the gate electrode GE. The stacked layer bodies LMS and LMD are also located directly above the gate electrode GE. In the example shown in FIG. 3, substantially the entire oxide semiconductor SC including the source region S1 and drain region D1 is located directly above the gate electrode GE.

A length L1S of the stacked layer body LMS is equivalent to a length L11S of the low-resistance region LS1. A length L1D of the stacked layer body LMD is equivalent to a length L11D of the low-resistance region LD1. Here, for example, the length L1S is equivalent to the length L1D, and the length L11S is equivalent to the length L11D.

However, depending on the film thickness of the oxide semiconductor SC, the length L1S and the length L11S may not necessarily coincide with each other and the length L1D and the length L11D may not necessarily coincide with each other. For example, when the film thickness of the oxide semiconductor SC is 50 nm or less, the length L1S may be greater than the length L11S, and similarly, the length L1D may be greater than the length L11D.

In this specification, for example, the insulating film 11 corresponds to the first insulating film (or the first inorganic insulating film), the insulating film 12 corresponds to the second insulating film (or the second inorganic insulating film), and the insulating film 13 corresponds to the third insulating film (or the third inorganic insulating film).

Next, an example of the manufacturing method for the above-described transistors TR will be described. The first transistor TR1 and the second transistor TR2 described above can be manufactured by the method of manufacturing the transistors TR described here.

FIG. 4 is a diagram illustrating the manufacturing method of the transistors TR.

First, a conductive film is formed on the insulating substrate 10, and the conductive film is patterned, thus forming the gate electrode GE (Step ST1). In the patterning here, the gate line GL is also formed at the same time as the gate electrode GE.

Subsequently, on the insulating substrate 10 and the gate electrode GE, silicon nitride is deposited and then silicon oxide is deposited, thus forming the insulating film 11, which is a stacked layer body of the thin films 11A and 11B (Step ST2).

Subsequently, on the insulating film 11 (on the thin film 11B formed of silicon oxide), an oxide semiconductor film is formed and then patterned, and thus forming an island-shaped oxide semiconductor SC directly above the gate electrode GE (Step ST3).

Subsequently, the workpiece formed up to the oxide semiconductor SC is baked (Step ST4). With the baking, oxygen contained in the oxide semiconductor SC is homogenized in distribution and also the release of hydrogen contained in the insulating film 11 is promoted.

Figure 5:
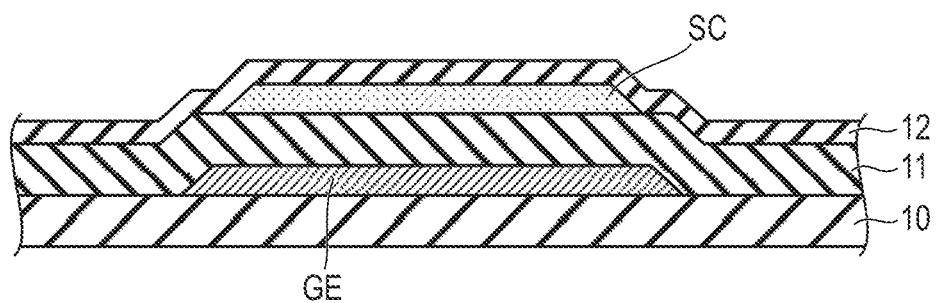
FIG. 5 is a cross-sectional view illustrating a processing step of forming the insulating film 12.

Subsequently, on the insulating film 11 and the oxide semiconductor SC, silicon oxide is deposited, thereby forming the insulating film 12 (Step ST5). Thus, as shown in FIG. 5, the insulating film 11 and the oxide semiconductor SC are covered by the insulating film 12. Further, at this time, a portion of the oxide semiconductor SC, which is close to the surface is reduced by the hydrogen contained in the silane gas used to form the insulating film 12. As a result, the resistance of the oxide semiconductor SC is slightly lowered.

Subsequently, the first and second openings CH1 and CH2 are formed in the insulating film 12 so as to penetrate therethrough to the oxide semiconductor SC (Step ST6).

Subsequently, a conductive film is formed on the insulating film 12, and the conductive film is patterned, thus forming the source electrode SE and the drain electrode DE (Step ST7). In the patterning here, the source line SL is also formed at the same time as the source electrode SE.

Figure 6:
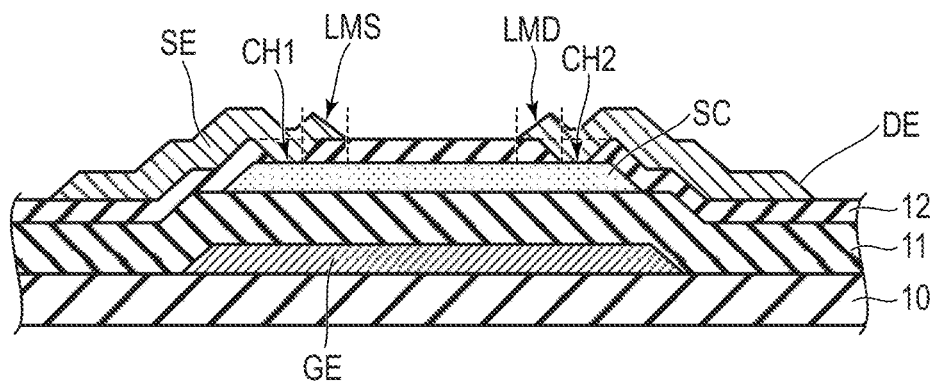
FIG. 6 is a cross-sectional view illustrating a processing step of forming a source electrode SE and a drain electrode DE.

Thus, as shown in FIG. 6, the source electrode SE is brought into contact with the oxide semiconductor SC in the first opening CH1, and the drain electrode DE is brought into contact with the oxide semiconductor SC in the second opening CH2. Between the first and second openings CH1 and CH2, the insulating film 12 is in contacts with the oxide semiconductor SC, and the stacked layer body LMS of the insulating film 12 and the source electrode SE and the stacked layer body LMD of the insulating film 12 and the drain electrode DE are formed.

In the portion of the oxide semiconductor SC, which is in contact with the source electrode SE in the first opening CH1, oxygen is absorbed by the source electrode SE and therefore the resistance is further lowered there. Similarly, in the portion of the oxide semiconductor SC, which is in contact with the drain electrode DE in the second opening CH2, oxygen is absorbed by the drain electrode DE, thereby even lower the resistance further.

Figure 7:
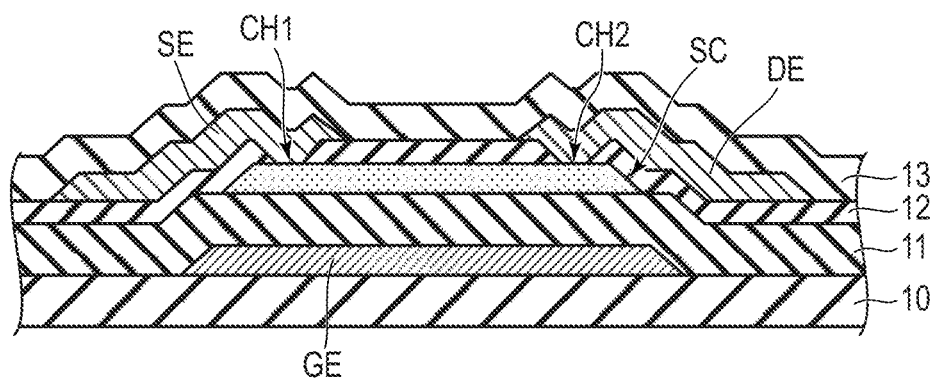
FIG. 7 is a cross-sectional view illustrating a processing step of forming an insulating film 13.

Then, silicon oxide is deposited on the insulating film 12, the source electrode SE and the drain electrode DE, thus forming the insulating film 13 (Step ST8). Thus, as shown in FIG. 7, the source electrode SE and the drain electrode DE are covered by the insulating film 13, and the insulating film 12 between the source electrode SE and the drain electrode DE is covered by the insulating film 13.

Subsequently, the workpiece formed up to the insulating film 13 is baked (Step ST9). With the baking, oxygen contained in the insulating film 13 is supplied to the oxide semiconductor SC via the insulating film 12.

Figure 8:
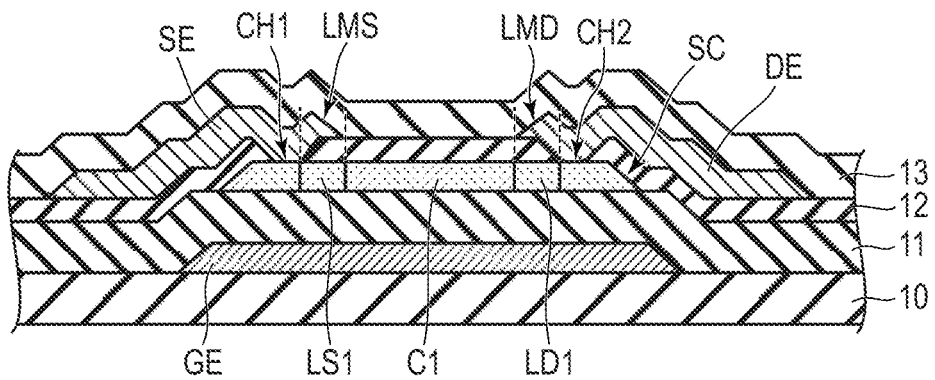
FIG. 8 is a cross-sectional view illustrating a processing step of forming a channel region C1 and low-resistance regions LS1 and LD1.

As shown in FIG. 8, between the source electrode SE and the drain electrode DE, oxygen is supplied from the insulating film 13 to the oxide semiconductor SC via the insulating film 12. Thus, the region of the oxide semiconductor SC, which overlaps the gap between the source electrode SE and the drain electrode DE is sufficiently oxidized, thus forming the channel region C1.

Further, at this time, in the region adjacent to the channel region C1, the source electrode SE and the drain electrode DE each serve as a mask, and the amount of oxygen supplied from the insulating film 13 to the oxide semiconductor SC is decreased. Therefore, the oxidation of the regions of the oxide semiconductor SC, which overlaps the source electrode SE and the drain electrode DE, respectively, is suppressed. Thus, oxygen is supplied to the region of the oxide semiconductor SC, which overlap the stacked layer body of the insulating film 12 and the source electrode SE, and to the region which overlap the stacked layer body of the insulating film 12 and the drain electrode DE, but the low-resistance regions LS1 and LD1 having a resistance lower than that of the channel region C1 are formed in these regions.

Figure 9:
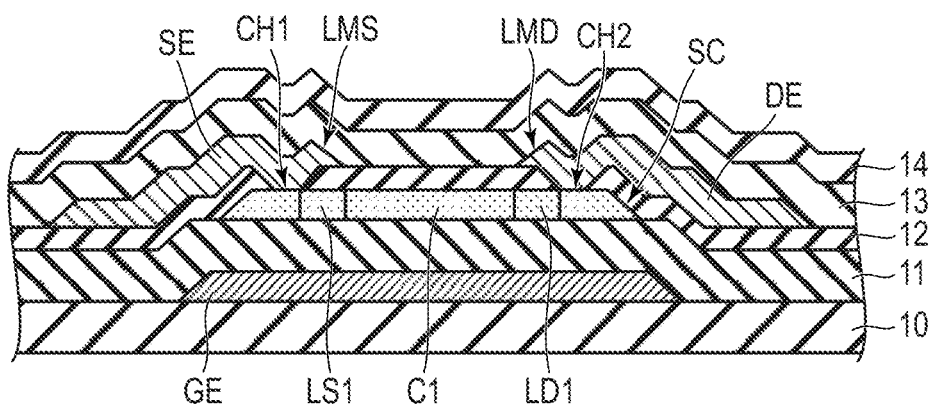
FIG. 9 is a cross-sectional view illustrating a processing step of forming an insulating film 14.

Subsequently, silicon nitride is deposited on the insulating film 13, thus forming the insulating film 14 (Step ST10). Thus, as shown in FIG. 9, the insulating film 13 is covered by the insulating film 14. The insulating film 14 functions as a moisture blocking layer, for example, but it may be omitted.

Incidentally, in a transistor configured with the oxide semiconductor SC as a semiconductor (referred to as an oxide semiconductor transistor), degradation of the oxide semiconductor SC due to hot carrier may occur due to the application of high voltage between the source and drain, thereby causing a significant shift in threshold voltage.

In this embodiment, the oxide semiconductor SC includes low-resistance regions LS1 and LD1 adjacent to the channel region C1. With this configuration, the degradation of the oxide semiconductor SC due to hot carrier can be suppressed. Therefore, the shift in threshold voltage is suppressed, thereby making it possible to improve the reliability.

The low-resistance regions LS1 and LD1 are formed simultaneously with the channel region C1 due to the difference in oxygen supply when forming the channel region C1, as described above. That is, between the source electrode SE and the drain electrode DE, the insulating films 12 and 13 are stacked on the oxide semiconductor SC, and as oxygen is supplied from the insulating films 12 and 13, the channel region C1 is formed.

On the other hand, in the region adjacent to the channel region C1, the source electrode SE and the drain electrode DE serve as barriers in the oxygen supply path, and therefore the amount of oxygen supplied is reduced as compared to that of the region between the source electrode SE and the drain electrode DE. Therefore, in the region of the oxide semiconductor SC, which is adjacent to the channel region C1, the degree of oxidation is limited to a smaller extent as compared to that of the channel region C1, and the low-resistance regions LS1 and LD1 are formed. Thus, a highly reliable oxide semiconductor transistor can be easily formed.

The length L11S of the low-resistance region LS1 can be adjusted by the length of the source electrode SE extending between the first and second openings CH1 and CH2 (or the length L1S of the stacked layer body LMS of the insulating film 12 and the source electrode SE). The length L11D of the low-resistance region LD1 can be adjusted by the length of the drain electrode DE extending between the first and second openings CH1 and CH2 (or the length L1D of the stacked layer body LMD of the insulating film 12 and the drain electrode DE).

Next, the inventors conducted a reliability test on the oxide semiconductor transistor. The stress conditions applied to the oxide semiconductor transistor are as follows.

The voltage applied to the gate electrode GE was set to ±38 V, the voltage applied between the source electrode SE and the drain electrode DE was set to ±28 V, and the voltage was applied continuously for 1000 sec in an environment of 60° C.

In the reliability test, the Vg-Id characteristics in the initial state, which is before the stress was applied were compared with the Vg-Id characteristics after the stress was applied. Note that reference symbol Vg represents the voltage (V) applied to the gate electrode GE, and Id is the current (A) output from the drain electrode DE. The results of the reliability test were plotted in a graph with the horizontal axis for the voltage Vg and the vertical axis for the current Id.

The Vg-Id characteristics were graphed for situations before and after the stress is applied in each of the case (1) where the voltage between the source and drain was set to 0.1 V (A), the case (2) where the voltage between the source and drain was set to 15 V (B) and the case (3) where the voltage between the source and drain was set to 30 V (D).

Figure 10:
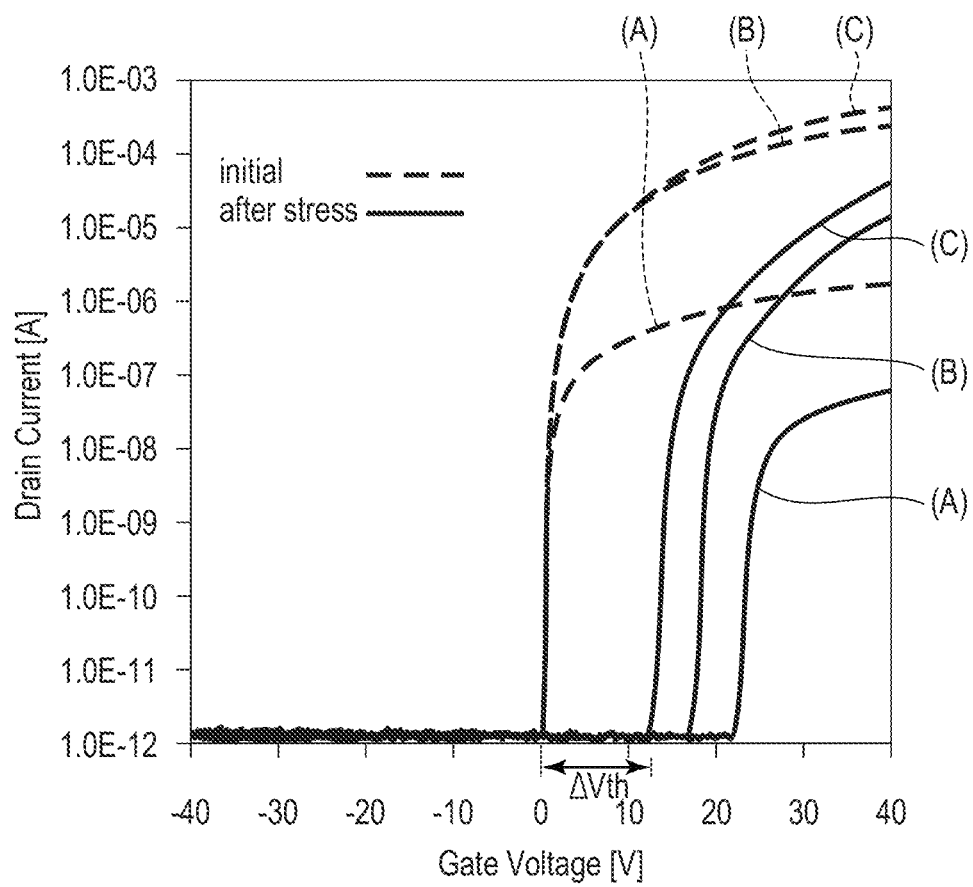
FIG. 10 shows results of a reliability test of an oxide semiconductor transistor.

FIG. 10 is a diagram showing the results of the reliability test of the oxide semiconductor transistor. In the oxide semiconductor transistor tested, the film thickness of the oxide semiconductor SC was set to 30 nm.

Comparing the Vg-Id characteristics before and after the application of stress, it was confirmed that the gate voltage (threshold voltage) at which the drain current is output shifted significantly. Here, focusing on the Vg-Id characteristics of the case (C) where the voltage between the source and drain was set to 30 V, the difference between the threshold voltages obtained before and after the application of stress is defined as the shift amount ΔVth.

Next, the above-described reliability test was carried out to examine the relationship between the lengths of the low-resistance regions LS1 and LD1 and the shift amount ΔVth under the conditions that the film thickness of the oxide semiconductor SC was set constant and using lengths of the low-resistance regions LS1 and LD1 as parameters.

FIG. 11 is a diagram showing the relationship between the lengths of the low resistance regions LS1 and LD1 and the shift amount ΔVth. Note that in the oxide semiconductor transistor, the length L11S of the low-resistance region LS1 and the length L11D of the low-resistance region LD1, were assumed to be equivalent to each other. The horizontal axis of the figure indicates the length of the low-resistance region (L11S or L11D), and the vertical axis indicates the shift amount ΔVth.

As shown in the figure, it was confirmed that when the length of the low-resistance region was 1.2 μm or more, the shift amount ΔVth became extremely small, and when the length of the low resistance region was 1.5 μm or more, the shift amount ΔVth became substantially zero. Therefore, in this embodiment, from the viewpoint of reducing the shift amount ΔVth, the length L11S of the low-resistance region LS1 (or the length L1S of the stacked layer body LMS) and the length L11D of the low-resistance region LD1 (or the length L1D of the stacked layer body LMD) should both preferably be 1.5 μm or more.

The oxide semiconductor transistor has such a characteristic as extremely low off-leakage current. Therefore, the oxide semiconductor transistor can hold the charge written in a pixel capacitance for a long time and can continue to hold the desired voltage, and thus it is appropriate as a switching element (second transistor TR2) for the pixel PX.

On the other hand, the first transistor TR1 included in the shift registers SR of the gate drivers GD1 and GD2, is required to have high mobility and high withstand voltage characteristics. Therefore, in this embodiment, an oxide semiconductor transistor is applied as the first transistor TR1. Further, in the oxide semiconductor transistor, low-resistance regions LS1 and LD1 with a length of 1.5 μm or more are provided. With this configuration, the oxide semiconductor transistor can obtain high withstand voltage characteristics with respect to a high voltage that can be applied between the source and drain.

Moreover, the oxide semiconductor transistor has a bottom gate structure which comprises a gate electrode GE between the oxide semiconductor SC and the insulating substrate 10. Further, the low-resistance regions LS1 and LD1 are located directly above the gate electrode GE. Furthermore, the insulating film 11 interposed between the gate electrode GE and the oxide semiconductor SC has a film thickness of 300 nm or more. With this configuration, the oxide semiconductor transistor can obtain high withstand voltage characteristics with respect to a high voltage that may be applied to the gate electrode GE.

Note that the inventors conducted the reliability test described above for an oxide semiconductor transistor with an etch stop structure described in this embodiment and an oxide semiconductor transistor with a channel etch structure which does not comprise the insulating film 12. According to the results, the oxide semiconductor transistor with the etch stop structure exhibited a shift amount ΔVth of 0.5 V. In contrast, the oxide semiconductor transistor with the channel etch structure exhibited a shift amount ΔVth of 14.1 V.

Further, the above-described reliability test was conducted using the size of the capacitance involved in the oxide semiconductor transistor as a parameter. According to the results, the oxide semiconductor transistor with the etch stop structure did not exhibit significant change in the shift amount ΔVth regardless of the size of the capacitance. On the other hand, it was confirmed that in the oxide semiconductor transistors with the channel etch structure, the shift amount ΔVth tended to increase as the capacitance size increased.

Based on the results of these reliability tests, it was confirmed that the oxide semiconductor transistor with the etch stop structure described in this embodiment has higher reliability as compared to the oxide semiconductor transistor with the channel etch structure.

Next, in a mother substrate in which a plurality of first substrates SUB1 can be formed at once, the above-described reliability test was conducted for oxide semiconductor transistors formed in a center portion of the substrate and those formed in the periphery portion of the substrate. Here, the lengths of the low-resistance regions were set to be constant, and the film thickness of the oxide semiconductor SC was used as a parameter, and the relationship between the film thickness of the oxide semiconductor SC and the shift amount ΔVth was examined in the reliability test.

FIG. 12 is a diagram showing the relationship between the film thickness of the oxide semiconductor SC and the shift amount ΔVth. The horizontal axis of the figure indicates the film thickness of the oxide semiconductor SC, and the vertical axis indicates the shift amount ΔVth. Squares in the figure show the test results of the oxide semiconductor transistors formed in the periphery portion of the mother substrate, and circles in the figure show the test results of the oxide semiconductor transistors formed in the center portion of the mother substrate.

As shown in the figure, when the film thickness of the oxide semiconductor SC is 30 nm or more, the oxide semiconductor transistors in the center portion of the mother substrate exhibited no substantial change in the shift amount ΔVth (about 2 V or less), and the shift amount ΔVth was extremely small. On the other hand, for the oxide semiconductor transistors in the periphery portion of the mother substrate, it was confirmed that the shift amount Vth became smaller as the film thickness is greater.

Here, it was confirmed that when the film thickness of the oxide semiconductor SC is 50 nm or more, more preferably the film thickness is 60 nm or more, the oxide semiconductor transistors in the center portion and the periphery portion of the mother substrate all exhibited an equivalent shift amount ΔVth, and the shift amount ΔVth was extremely small (about 2 V or less). Therefore, in this embodiment, from the viewpoint of reducing the shift amount ΔVth of the oxide semiconductor transistors formed in the mother substrate and improving the uniformity of the shift amount ΔVth in the plane of the mother substrate, the film thickness of the oxide semiconductor SC should preferably be 60 nm or more.

As explained above, according to the present embodiments, a method for manufacturing a semiconductor device that can improve reliability can be provided.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

Note that the embodiments are described in connection with the case of the electrophoretic display device required to have high drive voltage, but the present invention can also be applied to liquid crystal displays that require an application voltage higher than those of ordinary liquid crystal displays, and to polymer-dispersed liquid crystals and high-speed drive displays using them as liquid crystal displays for high-speed response.

What is claimed is:

1. A method of manufacturing a semiconductor device, comprising:
    forming a gate electrode;
    forming a first insulating film which covers the gate electrode;
    forming an island-shaped oxide semiconductor in contact with the first insulating film above the first gate electrode;
    forming a second insulating film which covers the oxide semiconductor;
    forming first and second openings penetrating to the oxide semiconductor in the second insulating film;
    forming a source electrode in contact with the oxide semiconductor in the first opening;
    forming a drain electrode in contact with the oxide semiconductor in the second opening;
    forming a third insulating film which covers the source electrode and the drain electrode;
    forming a channel region between the source electrode and the drain electrode by supplying oxygen from the third insulating film to the oxide semiconductor via the second insulating film; and
    forming a low-resistance region of a resistance lower than that of the channel region, in a region overlapping a stacked layer body of the second insulating film and the source electrode between the first opening and the second opening, and in a region overlapping a stacked layer body of the second insulating film and the drain electrode between the first opening and the second opening, in the oxide semiconductor, by supplying oxygen from the third insulating film to the oxide semiconductor via the second insulating film, wherein
    a length of the stacked layer body of the second insulating film and the source electrode between the first opening and the second opening, and a length of the stacked layer body of the second insulating film and the drain electrode between the first opening and the second opening is 1.5 μm or more.

2. The method of claim 1, wherein
the forming of the channel region and the forming of the low-resistance region are carried out by baking after the forming of the third insulating film.

3. The method of claim 2, wherein
the second insulating film and the third insulating film are formed of silicon oxide.

4. The method of claim 3, wherein
at least a thin film of the first insulating film, which is in contact with a lower surface of the oxide semiconductor is formed of silicon oxide.

5. The method of claim 3, wherein
a film thickness of the third insulating film is greater than a film thickness of the second insulating film.

6. The method of claim 3, wherein
the first insulating film is a stacked layer body of a first thin film which directly covers the gate electrode and a second thin film in contact with a lower surface of the oxide semiconductor,
the first thin film is formed of silicon nitride, and
the second thin film is formed of silicon oxide.

7. The method of claim 6, wherein
a film thickness of the second thin film is less than a film thickness of the first thin film.

8. The method of claim 1, wherein
a length of the low-resistance region is 1.5 μm or more.

9. The method of claim 8, wherein
a film thickness of the oxide semiconductor film is 60 nm or more.

* * * * *